(12) United States Patent
Renaud

(10) Patent No.: US 8,461,626 B2
(45) Date of Patent: Jun. 11, 2013

(54) HETERO-STRUCTURE FIELD EFFECT TRANSISTOR, INTEGRATED CIRCUIT INCLUDING A HETERO-STRUCTURE FIELD EFFECT TRANSISTOR AND METHOD FOR MANUFACTURING A HETERO-STRUCTURE FIELD EFFECT TRANSISTOR

(75) Inventor: Philippe Renaud, Cugneaux (FR)

(73) Assignee: Freescale Semiconductor, Inc., Austin, TX (US)

( * ) Notice: Subject to any disclaimer, the term of this patent is extended or adjusted under 35 U.S.C. 154(b) by 511 days.

(21) Appl. No.: 12/668,097

(22) PCT Filed: May 16, 2008

(86) PCT No.: PCT/IB2008/053467
§ 371 (c)(1),
(2), (4) Date: Jan. 7, 2010

(87) PCT Pub. No.: WO2009/007943
PCT Pub. Date: Jan. 15, 2009

(65) Prior Publication Data
US 2010/0187569 A1     Jul. 29, 2010

(30) Foreign Application Priority Data

Jul. 9, 2007   (WO) .................. PCT/IB2007/053436

(51) Int. Cl.
*H01L 29/66* (2006.01)
*H01L 21/338* (2006.01)

(52) U.S. Cl.
USPC ............ 257/194; 257/E29.246; 257/E21.403; 438/172

(58) Field of Classification Search
USPC ............ 257/190–192, 194, 183, 76, E29.246, 257/E29.315, E29.002, E21.448; 438/172
See application file for complete search history.

(56) References Cited

U.S. PATENT DOCUMENTS 5,389,571 A * 2/1995 Takeuchi et al. ................ 117/89
5,399,887 A   3/1995 Weitzel et al.

(Continued)

FOREIGN PATENT DOCUMENTS

WO   2005/079370 A2   9/2005
WO   2006/008925 A1   1/2006

(Continued)

OTHER PUBLICATIONS

Ben-Yaacov, AlGaN/GaN current aperture vertical electron transistors with regrown channel, J. Appl Phys. 95, pp. 2073-2078 (2004).*
Ben-Yaacov I et al: "AlGaN/GaN Current Aperture Vertical Electron Transistors" Device Research Conference, 2002. 60th DRC. Conference Digest Jun. 24-26, 2002, Piscataway, NJ, USA, IEEE, Jun. 24, 2002, pp. 31-32.

(Continued)

*Primary Examiner* — Matthew Landau
*Assistant Examiner* — Latanya N Crawford

(57) ABSTRACT

A hetero-structure field effect transistor (HFET). The HFET may include a first contact and a second contact and a hetero-junction structure. The hetero-junction structure may include a first layer made from a first semiconductor material and a second layer made from a second semiconductor material. An interface at which the first layer and the second layer are in contact with each other may be provided, along which a two dimensional electron gas (2DEG) is formed in a part of the first layer directly adjacent to the interface, for propagating of electrical signals from the first contact to the second contact or vice versa. The transistor may further include a gate structure for controlling a conductance of the channel; a substrate layer made from a substrate semiconductor material, and a dielectric layer separating the first layer from the substrate layer. The second contact may include an electrical connection between the substrate layer and the first layer. The electrical connection may include a passage through the dielectric layer filled with an electrically conducting material which is electrically connected to the first layer.

20 Claims, 1 Drawing Sheet

U.S. PATENT DOCUMENTS

| | | | |
|---|---|---|---|
| 6,555,850 B1* | 4/2003 | Sakamoto et al. | 257/192 |
| 7,955,918 B2* | 6/2011 | Wu et al. | 438/191 |
| 2005/0258450 A1* | 11/2005 | Saxler | 257/192 |
| 2005/0274977 A1 | 12/2005 | Saito et al. | |
| 2006/0226412 A1* | 10/2006 | Saxler et al. | 257/11 |
| 2006/0284167 A1* | 12/2006 | Augustine et al. | 257/40 |
| 2006/0284247 A1* | 12/2006 | Augustine et al. | 257/338 |
| 2008/0073670 A1* | 3/2008 | Yang et al. | 257/194 |
| 2008/0128862 A1* | 6/2008 | Sugimoto et al. | 257/615 |
| 2009/0315037 A1* | 12/2009 | Kikkawa | 257/76 |
| 2011/0278598 A1* | 11/2011 | Renaud | 257/77 |

FOREIGN PATENT DOCUMENTS

| | | |
|---|---|---|
| WO | 2006/052025 A2 | 5/2006 |
| WO | 2006/052052 A1 | 5/2006 |
| WO | 2006/110204 A | 10/2006 |
| WO | 2006/127227 A2 | 11/2006 |
| WO | 2007/081932 A | 7/2007 |

OTHER PUBLICATIONS

Kruger O et al: "Laser-Assisted Processing of VIAs for AlGaN/GaN HEMTs on SiC Substrates" IEEE Electron Device Letters IEEE, USA, vol. 27, No. 6 Jun. 2006, pp. 425-427.

H. Ueda et al: "Wide-Bandgap Semiconductor Devices for Automobile Applications" CS Mantech Conference, Apr. 24-27, 2006, Vancouver, British Columbia, Canada, p. 37-40.

N. Zhang et al: "Large Area GaN HEMT Power Devices for Power Electronic Applications: Switching and Temperature Characteristics" IEEE 2003, Jun. 15-19, 2003, vol. 1, pp. 233-237.

Y. Gao et at: "AlGaN Current Aperture Vertical Electron Transistors Fabricated by Photoelectrochemical Wet Etching" Electronics Letters, Jan. 9, 2003, vol. 39 No. 1, pp. 148-149.

International Search Report and Written Opinion correlating to PCT/IB2007/053436 dated Apr. 4, 2008.

* cited by examiner

HETERO-STRUCTURE FIELD EFFECT TRANSISTOR, INTEGRATED CIRCUIT INCLUDING A HETERO-STRUCTURE FIELD EFFECT TRANSISTOR AND METHOD FOR MANUFACTURING A HETERO-STRUCTURE FIELD EFFECT TRANSISTOR

FIELD OF THE INVENTION

This invention relates to a hetero-structure field effect transistor, to an integrated circuit including a hetero-structure field effect transistor and to a method for manufacturing a hetero-structure field effect transistor.

BACKGROUND OF THE INVENTION

A hetero-structure field effect transistor is known from International patent application publication WO 2005/079370. The hetero-structure field effect transistor includes an AlGaN/GaN interface that obtains a high current carrying channel. The bidirectional switch operates with at least one gate that prevents or permits the establishment of a two dimensional electron gas to form the current carrying channel for the bidirectional switch.

From International patent application publication WO 2006/052052 a semiconductor device is known. The semiconductor device has a base plate made from n-doped GaN (n-GaN) with a low resistance. A drain electrode is formed on the base plate. A top surface of the semiconductor base plate is covered by an insulating layer formed from AlN, leaving a non-covered surface. A top surface of the insulating layer is covered by a semiconductor layer with a lower semiconductor layer made from n-GaN and an upper semiconductor layer made from AlGaN. A gate electrode made from polysilicon is formed, via a gate insulating layer, on a top surface of the upper semiconductor layer. A source electrode made from aluminium makes ohmic contact with the surface of the upper semiconductor layer. However, a disadvantage of the semiconductor device disclosed in this publication is that the semiconductor device exhibits a large leakage current since, although it is described that a 2 dimensional electron gas (2DEG) is obtained, the flowing electrons are not confined to a 2-dimensional region but can actually flow from source to drain over the whole thickness of the lower semiconductor layer, even when a negative voltage is applied at the gate electrode.

Ben-Yaacov et al, "AlGaN/GaN current aperture vertical electron transistors", *Device research conference*, 2002. 60th *DRC Conference digest* Jun. 24-26, 2002, Piscataway, N.J. USA IEEE, p. 31-32, discloses an AlGaN/GaN current aperture vertical electron transistor (CAVET). The cavet consist of a source region separated from a drain region by an insulating layer. The insulating layer includes a narrow aperture which is filled with conducting material. A Schottky gate is located directly above the aperture and is used to modulate the current passing through the aperture.

However, a disadvantage of the device disclosed in this 'Ben-Yaacov' publication is that in operation it exhibits relatively high resistive losses and the high leakage current does not enable to operate the device in a off-state configuration up to a breakdown source-drain voltage.

SUMMARY OF THE INVENTION

The present invention provides a hetero-structure field effect transistor, an integrated circuit including a hetero-structure field effect transistor and a method for manufacturing a hetero-structure field effect transistor as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

DETAILED DESCRIPTION OF THE PREFERRED EMBODIMENTS

Figure 1:
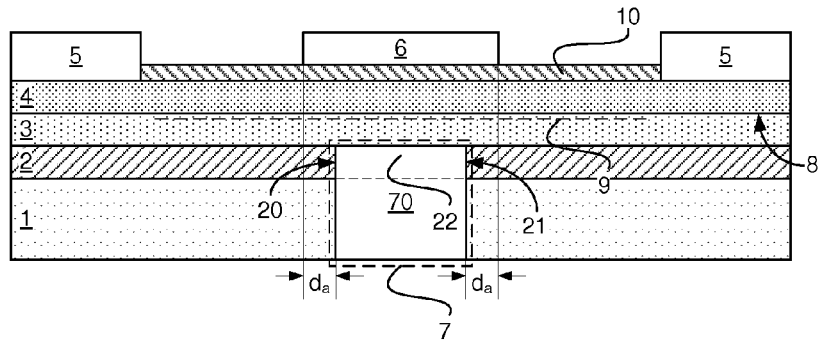
FIG. 1 schematically shows a cross-sectional view of a first example of an embodiment of a hetero-structure field effect transistor.

Referring to FIGS. 1-4 examples of a hetero-structure field effect transistor (HFET), which may also be referred to as a high electron mobility transistor (HEMT), are shown therein. As shown in the example, the HFET may include one or more first contacts 5, The HFET may further include second contact 7. The HFET may for example be implemented as a high power switch which can control currents at high voltages, for example at voltages of 50 V or more and/or 1000 V of less.

The HFET may include a hetero-junction structure which connects the first contact 5 to the second contact 7. As shown, the hetero-junction structure may include a first layer 3 made from a first semiconductor material and a second layer 4 made from a second semiconductor material. An interface 8 may be present at which the first layer 3 and the second layer 4 are in contact with each other, along the interface 8 a two dimensional electron gas (2DEG) 9 may be formed in a part of the first layer 3 directly adjacent to the interface 8. As shown in the figures, the layers 3, 4 and the interface 8 may be substantially planar and be oriented parallel to a top surface of a wafer (which in FIG. 1 consists of a single substrate layer 1 but may include more layers). As shown in the examples, the first contact 5 and the second contact 7 may be electrically connected to the hetero-junction structure in order to propagate electrical signals from the first contact to the second contact or vice versa. The first contact 5 and the second contact 7 may for example be ohmic contacts or other suitable types of contacts As shown in the examples between the contacts 5 and the first layer 3 one or more other layers may be present (in this example the second layer 4). The other layers may for example be tunnelling layers which allow a conduction between the contacts 5 and the first layer 3 via tunnelling of charge carriers through the other layers. For example the second layer 4 may be an AlGAN layer which between the contacts 5 and the first layer 3 has a thickness of about 300 Angstrom. The contacts 5 may also be in direct contact with the first layer 3 and for example be provided in a recess in the second layer 4 (for example by etching the second layer 4 and thereafter depositing the contact layer(s) or/and by thermal diffusion).

As shown, the HFET may include a gate structure 6 via which the conductance of the path through the hetero-junction structure can be controlled In the examples, the gate structure 6 includes a gate layer which is separated from the second layer 4 by a dielectric layer 10. The dielectric layer 10 may for example be made of $Si_3N_4$, $SiO_2$ or other suitable type of isolator. The gate layer may be in capacitive contact with the second layer 4 and/or the first layer 3. Alternatively, the gate structure 6 may be in direct contact with the second layer or the first layer 3 to form a Schottky type potential barrier. In such case, the gate structure 6 may for example include a multi-layer structure. The multi-layer structure may for example include two or more metal layers, such as a Ti/Au or Ni/Au or Pt/Ti/Au or Pt/Au multilayer.

As shown, the hetero junction structure may be provided on a substrate layer 1 made from a substrate semiconductor material containing silicon. A dielectric layer 2 may be present which separates the first layer 3 from the substrate layer 1. The dielectric layer 2 may for example be a semi-resistive layer such as Fe-doped GaN or semi-resistive-p-type layer such as Mg-doped GaN. The second contact 7 may, as shown, include an electrical connection 70 between the substrate layer 1 and the first layer 3. The electrical connection may for example extend through a passage 22 through the dielectric layer 2. For example, the passage 22 may be filled with an electrically conducting material to form the electrical connection 70 which is electrically connected to the first layer 3.

Because the substrate layer 1 is separated from the first layer 3, the leakage of current from the first layer to the substrate layer 1 may be reduced. Furthermore, the dimensions of the HFET may be reduced since the second contact 7 may be positioned, in a longitudinal direction of the layers 1-4, directly adjacent to the gate structure 6 or have an overlap with the gate structure 6 in the longitudinal direction.

The first layer 3 and the second layer 4 may be implemented in any manner suitable for the specific implementation and may be made of any semiconductor material suitable to form a hetero-junction. The first layer 3 may for example be made from a not intentionally doped semiconductor material. Thereby, the first layer 3 can be provided with a high resistivity and the leakage current of the HFET in the off-state may be reduced. Without wishing to be bound to any theory, it is believed that the high resistivity confines the electrons of the 2DEG 9 within a sheet shaped region of the first layer 3 at the interface 8 thus inhibiting a leakage through parts of the first layer 3 which are remote from the interface 8. In addition, the 2DEG can provide a high sheet carrier density (for example as high as $8.10^{12}$ cm$^{-2}$ or more) and may have a high electron mobility (for example in the range of $1.6 \cdot 10^2 \cdot$cm$^2$/V or more). Furthermore, the 2DEG can have a low on-state resistance, for example a resistance as low as 3 m·OhmCm$^2$ or less may be obtained. The first layer 3 may for example have a thickness of 3 micrometers or less, such as 2 micrometers or less. The second layer 4 may for example have a thickness of less than 0.1 micrometer, such as several tenths of nanometers, such as 20 nm to 30 nm.

The first layer 3 and/or the second layer 4 may for example be made of one or more materials in the group consisting of: III-nitride material, binary III-nitride material, ternary III-nitride material, quaternary III-nitride material, GaN, AlGaN (for example having an concentration of 20% or more and/or 30% or less), InGaN, epitaxial grown material. The second semiconductor material has a band-gap different from a band-gap of the first semiconductor material. Thereby, the band-gaps at the interface 8 will bend, as is generally known in the art, and a potential well may be obtained in which the 2DEG 9 can be formed.

It should be noted that the 2DEG 9 may also be formed using other mechanisms. The second semiconductor material may for example have a lattice constant different from a lattice constant of the first semiconductor material, and the first semiconductor material may exhibit a piezoelectric polarization in a transversal direction from the interface towards the substrate layer. Thereby, due to the different lattice constant, the first semiconductor material will be stressed or strained and the first layer 3 will be charged at the interface 8. Thereby, the density of electrons at the interface 8 may be increased.

The gate structure 6 may be implemented in any manner suitable for the specific implementation. As shown in the example of FIGS. 1-4, the gate structure 6 may be provided at a side of the second layer 4 opposite to an interface side 8 at which the second layer 4 is in contact with the first layer 3. The gate structure 6 may be separated from the second layer 4 by a dielectric layer 10, for example made from silicon nitride or silicon-oxide, and be in capacitive contact with the second layer 4. The gate structure 6 may for example be made of a conducting material, including for example a metal, such as a chemical compound or alloy including Ti, Al, Ag, Cr, W, Pt, Ni, Pa or In, or a semiconductor material, such as poly-silicon, optionally provided with a suitable doping.

Figure 2:
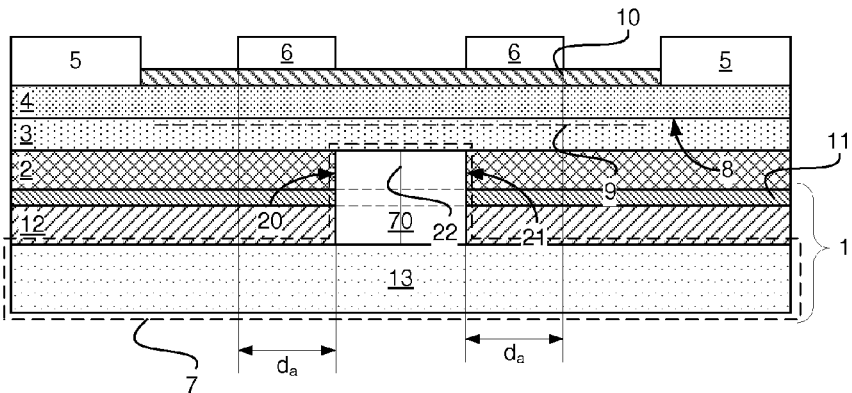
FIG. 2 schematically shows a cross-sectional view of a second example of an embodiment of a hetero-structure field effect transistor.

As shown in FIG. 2, the gate structure 6 may include a part which is positioned, in a longitudinal direction parallel to the interface side surface of the second layer 4, directly adjacent to an edge of the dielectric layer 2 which defines the passage 22. Thereby, the gate capacitance can be reduced for higher frequency operation and/or commutation capability (e.g. switching time) may be improved.

Figure 3:
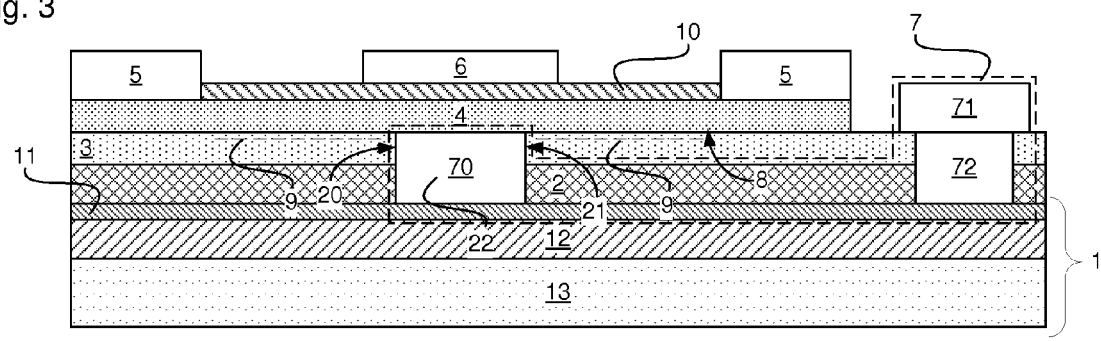
FIG. 3 schematically shows a cross-sectional view of a third example of an embodiment of a hetero-structure field effect transistor.
Figure 4:
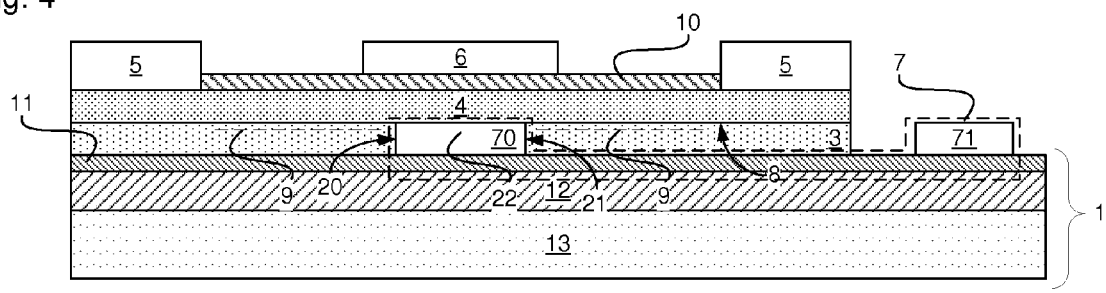
FIG. 4 schematically shows a cross-sectional view of a fourth example of an embodiment of a hetero-structure field effect transistor.

As shown in FIGS. 1, 3-4, the gate structure 6 may include a part which extends in the longitudinal direction over the passage 22. Thereby, manufacturing of the HFET can be easier and the breakdown voltage of the HFET can be improved.

The passage 22 may be implemented in any manner suitable for the specific implementation. For example, the passage 22 may be filled with an electrically conducting material having a higher conductivity than said first semiconductor material. Thereby, leakage current can be reduced. For example, the electrically conducting material may be a doped semiconductor material while the first layer is made of a not intentionally doped semiconductor material.

The passage 22 may for instance be filled with a doped material, e.g. an n-type doping, to be highly conductive, while the second layer 4 may be non-intentionally doped, to be highly electrically resistant. Thereby the leakage current when the gate contact is biased e.g. at a negative voltage of for example 5V or less, may be reduced.

As e.g. shown in FIG, passage 22 may extend through the dielectric layer 2 and optionally through the first layer 3. As shown in e.g. FIGS. 1 and 2, the passage 22 may be in directly contact with a bottom side of the first layer 3 (e.g. the side of the first layer 3 in contact with the dielectric layer 2). Alternatively, as shown in FIGS. 3 and 4, the passage 22 may be directly connected to the 2DEG 9. For example, the passage 22 may extend, through the first layer 3, up to the interface 8, to be in direct contact with the 2DEG 9. Thereby, current flowing through the 2DEG 9 will preferentially flow through the passage 22. Thus, current leakage may be reduced.

The passage 22 may be obtained in any manner suitable for the specific implementation. For example, the layers through which the passage 22 will extend may have been provided first. Thereafter, a passage 22 may have been provided through the layer(s) for example by etching the layers selectively. A suitable material may then be grown in the passage 22. Thus, the material grow will not extend laterally. Accordingly, a sharp transition between the, conductive, passage 22 and the layers through which the passage extends may be obtained.

The material may have been grown 20,21 in the passage, for example using a suitable epitaxial process such as metal-organic chemical vapor deposition (MOCVD) or molecular beam epitaxy (MBE) processes. For example, the passage 22 may be filled with a material which is grown horizontally, e.g. from sidewalls 20,21 inwards, such as from a first side wall 20 to an inside of the passage in a first direction and from a second side wall 21 of the passage to the inside in a second direction different from the first direction. It should be noted that in the figure, the sidewalls 20, 21 are shown as opposite sidewalls facing each other. However, it will be apparent that the sidewalls 20, 21 may be differently oriented parts of a continuous sidewall, such as different parts of a cylindrical sidewall, which defines the passage 22.

The material in the passage 22 can also be grown vertically, e.g. by epitaxy, after providing the passage 22, for example from the bottom of the passage (formed e.g. by the base layer 13 in FIG. 2 and by top layer 11 in the example of FIG. 3) to the top of the passage 22.

The substrate semiconductor material may include one or more materials of the group consisting of: SiC, doped or undoped Si, epitaxial grown material, crystalline material, poly-crystalline material. However, the electrical connection through the passage 22 may be obtained in another manner. The dielectric layer 2 may for example be made of a highly resistive semiconductor material which in the passage is provided with a dopant. For example, the dielectric layer 2 may be implemented as a layer made from GaN which outside the passage 22 is Fe doped or undoped while in the passage 22 is provided with a doping of Si.

The dielectric layer 2 may be implemented in any manner suitable for the specific implementation and may be made of any suitable isolating material. The dielectric layer 2 may for example be made of a material of the group consisting of: Silicon-oxide, Aluminium-Nitride, and epitaxial grown materials. For example the dielectric layer 2 may include a layer of silicon-oxide or aluminium nitride which separates the first layer 3 from a (poly)-crystalline silicon layer in the substrate. The dielectric layer 2 may also be a semi-resistive layer or a p-type semi-conductive layer. As e.g. shown in FIG. 4, the dielectric layer 2 may also be integrated in the first layer 3, for example in case first layer 3 is highly resistive.

As shown in FIG. 1, for example, the substrate layer 1 may be made of an isolating material and form a bulk material of a wafer. The electrical connection 70 may then extend through the substrate layer to a backside of the substrate layer 1. Thereby the HFET can be connected to devices on another substrate in a relatively simple manner.

However, the substrate layer 1 may be any type of substrate layer suitable for the specific implementation. For example, as shown in FIG. 2, the substrate layer 1 may be a laminate layer and include a top layer 11, a base layer 13 at a first side of the top layer 11 and, optionally, one or more intermediate layers 12 between the top layer 11 and the base layer 13. The substrate layer 1 may for example include a silicon carbide layer as the base layer 13 and a silicon layer as the top layer 11. The silicon layer may then be bonded to the silicon carbide layer by a electrically isolated bonding layer. As shown in FIG. 2, the first layer 3 may be provided on the silicon layer and, for example be separated from the top-layer 11 by the dielectric layer 2 or, as shown in FIG. 4 be positioned directly adjacent to the top-layer 11.

The connection 70 may connect the first layer 3 to a base layer 13 of the laminate substrate layer 1 for example. However, the connection 70 may alternatively connect the first layer 3 to another one of the substrate layer, for example to the top layer 11 (as shown in FIG. 3) or to a respective intermediate layer 12. The dielectric layer 2 may then, for example, separate a top latter 11 of the laminate substrate layer from the first layer 3, while the passage 22 may extend through the dielectric layer 2 and the layers 11,12 of the substrate layer 1 that separate the base layer 13 from the dielectric layer. Although not shown, it will be apparent that furthers layer may be present, e.g. below the base layer 13 in FIG. 2 or above the contacts 5,6, of the HFET. Also, for example, in case the substrate layer is made from Silicon-Carbide, such as poly-crystalline Silicon Carbide, the dielectric layer 2 may be silicon-oxide.

Also, for example, the dielectric layer 2 may be made from the same material as the first layer 3, and for example be made from a highly resistive or semi-insulating semiconductor material with has not been doped intentionally or has been doped with a resistance increasing dopant. For example, the dielectric layer 2 may be made from GaN, for example doped with Fe or Mg.

The dielectric layer 2 and the first layer 3 may be made from the same semiconductor material, and optionally have a different doping. As shown in FIG. 4, for example, the first layer 3 may be the same layer as the dielectric layer 2. The first layer 3 may for example be made of a highly resistive semi-conductor material, such as undoped GaN or non-intentionally doped (nid) GaN.

As shown in FIGS. 3 and 4, the electrical connection 70 may extend through the first layer 3. Thus, the second contact 7 may include an area of the first layer 3 provided with a higher conductivity than the parts of the first layer outside the area, for example by providing a different doping in the area defining the electrical connection than outside the area.

In the foregoing specification, the invention has been described with reference to specific examples of embodiments of the invention. It will, however, be evident that various modifications and changes may be made therein without departing from the broader spirit and scope of the invention as set forth in the appended claims. For example, the transistor may be part of an integrated circuit which includes one or more transistors. Also, although in the figures cross-sectional views are shown, it will be apparent that the transistor may for example have a circular or rectangular shape. Also, for instance, the substrate isolation could also be performed using a pn junction isolation.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

The invention claimed is:

1. A hetero-structure field effect transistor, comprising:
a first contact and a second contact;
a hetero-junction structure, said hetero-junction structure including:
a first layer made from a first semiconductor material;
a second layer made from a second semiconductor material; and
an interface at which said first layer and said second layer are in contact with each other; a two dimensional electron gas is formed in a part of said first layer directly adjacent to said interface, for propagating of electrical signals from the first contact to the second contact or vice versa;
said transistor further including:
a gate structure for controlling a conductance of a path through the hetero-junction structure, between the first contact and the second contact;
a substrate layer including a silicon carbide layer and a silicon layer, said silicon layer being bonded to said silicon carbide layer by an electrically isolated bonding layer, and wherein said first layer is provided on said silicon layer; and
a dielectric layer separating said first layer from said substrate layer;
said second contact includes an electrical connection between said substrate layer and said first layer, said electrical connection including a passage through at least said dielectric layer, said passage being filled with an epitaxial doped semiconductor material which is electrically connected to the first layer, said epitaxial doped semiconductor material having a higher conductivity than said first semiconductor material.

2. A transistor as claimed in claim 1, wherein said passage is directly in contact with said two dimensional electron gas.

3. A transistor as claimed in claim 1, wherein said first semiconductor material is not intentionally doped.

4. A transistor as claimed in claim 1, wherein said gate structure is provided at a side of said second layer opposite to an interface side at which the second layer is in contact with the first layer, and wherein:
said gate structure includes at least one of the group consisting of:
a part which is positioned, in a longitudinal direction parallel to said interface side surface, directly adjacent to an edge of said dielectric layer which defines said passage;
a part which extends in said longitudinal direction over said passage.

5. A transistor as claimed in claim 1, wherein said passage is filled with a laterally grown material or a vertically grown material.

6. A transistor as claimed in claim 1, wherein said second semiconductor material has a band-gap different from a band-gap of the first semiconductor material.

7. A transistor as claimed in claim 1, wherein said second semiconductor material has a lattice constant different from a lattice constant of the first semiconductor material, and wherein said first semiconductor material exhibits a piezoelectric polarization in a transversal direction from said interface towards said substrate layer.

8. A transistor as claimed in claim 1, wherein said first semiconductor and/or said second semiconductor material includes one or more materials of the group consisting of: III-nitride material, binary III-nitride material, ternary III-nitride material, quaternary III-nitride material, GaN, AlGaN, InGaN, and epitaxial grown material.

9. A transistor as claimed in claim 1, wherein said dielectric layer is made of a material including one or more materials of the group consisting of: $SiO_2$, AlN, GaN, and epitaxial grown material.

10. A transistor as claimed in claim 1, wherein said first layer has a thickness of 3 micrometers or less, such as 2 micrometers or less.

11. A transistor as claimed in claim 1, wherein said dielectric layer and said first layer are made from the same semiconductor material, and optionally have a different doping.

12. A transistor as claimed in claim 1, wherein the dielectric layer is made of a semiconductor material which in the passage is provided with a dopant.

13. A transistor as claimed in claim 1, wherein said electrical connection electrically connects said silicon layer or said silicon carbide layer to said first layer.

14. A transistor as claimed in claim 1, wherein said electrical connection extends through said substrate layer to a backside of said substrate layer.

15. An integrated circuit including at least one transistor as claimed in claim 1.

16. A transistor as claimed in claim 2, wherein said second semiconductor material has a lattice constant different from a lattice constant of the first semiconductor material, and wherein said first semiconductor material exhibits a piezoelectric polarization in a transversal direction from said interface towards said substrate layer.

17. A method for manufacturing a hetero-structure field effect transistor, comprising:
providing a first contact and a second contact;
providing a hetero junction structure, said hetero junction structure, including:
providing a first layer made from a first semiconductor material
providing a second layer made from a second semiconductor material; and
providing an interface at which said first layer and said second layer are in contact with each other, forming along said interface a two dimensional electron gas in a part of the first layer is formed, for propagating of electrical signals from the first contact to the second contact or vice versa;
said method further including:
providing a gate structure for controlling a conductance of a path though said heterojunction structure, between said first contact and said second contact;
providing a substrate layer, wherein said substrate layer includes a silicon carbide layer and a silicon layer, said silicon layer being bonded to said silicon carbide layer by an electrically isolated bonding layer, and wherein said first layer is provided on said silicon layer;
providing a dielectric layer separating said first layer from said substrate layer;
providing an electrical connection between said substrate layer and said first layer, said electrical connection including a passage through said dielectric layer filled with an epitaxial doped semiconductor material which is electrically connected to the first layer, said epitaxial doped semiconductor material having a higher conductivity than said first semiconductor material.

18. A hetero-structure field effect transistor, comprising:
a first contact and a second contact;

a hetero-junction structure, said hetero-junction structure including:
  a first layer made from a first semiconductor material;
  a second layer made from a second semiconductor material; and
  an interface at which said first layer and said second layer are in contact with each other; a two dimensional electron gas is formed in a part of said first layer directly adjacent to said interface, for propagating of electrical signals from the first contact to the second contact or vice versa;
said transistor further including:
  a gate structure for controlling a conductance of a path through the hetero-junction structure, between the first contact and the second contact;
  a substrate layer, wherein said substrate layer is a laminate layer including an electrically conducting base layer, an electrically conducting top layer positioned between said base layer and said first layer, and an electrically isolating intermediate layer positioned between said base layer and said top layer; and
  a dielectric layer separating said first layer from said substrate layer;
  said second contact includes an electrical connection between said substrate layer and said first layer, said electrical connection including a passage through at least said dielectric layer, said passage being filled with an epitaxial doped semiconductor material which is electrically connected to the first layer, said epitaxial doped semiconductor material having a higher conductivity than said first semiconductor material.

19. A transistor as claimed in claim 18, wherein said dielectric layer is made of a material including one or more materials of the group consisting of: $SiO_2$, AlN, GaN, and epitaxial grown material.

20. A transistor as claimed in claim 18, wherein said second semiconductor material has a lattice constant different from a lattice constant of the first semiconductor material, and wherein said first semiconductor material exhibits a piezoelectric polarization in a transversal direction from said interface towards said substrate layer.

* * * * *